United States Patent
Ohta et al.

(10) Patent No.: US 7,205,617 B2
(45) Date of Patent: Apr. 17, 2007

(54) SEMICONDUCTOR DEVICE INCLUDING ACTIVE REGIONS AND GATE ELECTRODES FOR FIELD EFFECT TRANSISTORS, WITH A TRENCH FORMED BETWEEN THE ACTIVE REGIONS

(75) Inventors: Hiroyuki Ohta, Tsuchiura (JP); Yukihiro Kumagai, Chiyoda (JP); Yasuo Sonobe, Kokubunji (JP); Kousuke Ishibashi, Oume (JP); Yasushi Tainaka, Oume (JP); Masafumi Miyamoto, Higashiyamato (JP); Hideo Miura, Koshigaya (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/330,196

(22) Filed: Dec. 30, 2002

(65) Prior Publication Data

US 2003/0127697 A1    Jul. 10, 2003

(30) Foreign Application Priority Data

Jan. 10, 2002    (JP)    .............................. 2002-002919

(51) Int. Cl.
*H01L 29/76*    (2006.01)
*H01L 29/00*    (2006.01)

(52) U.S. Cl. ....................... 257/374; 257/206; 257/513

(58) Field of Classification Search ................ 257/368, 257/737, 506, 510, 513–515, 204–206, 374
See application file for complete search history.

(56) References Cited

U.S. PATENT DOCUMENTS

2003/0127663 A1*    7/2003    Ito ............................. 257/204

FOREIGN PATENT DOCUMENTS

| JP | A-07-240501 | 9/1995 |
|----|----|----|
| JP | 11-340337 | 12/1999 |
| JP | A-2001-044397 | 2/2001 |

OTHER PUBLICATIONS

Hamada A., et al, *A New Aspect of Mechanical Stress Effects in Scaled MOS Devices*, IEEE Transactions on Electron Devices, vol. 38, No. 4, pp. 895-900, Apr. 1991.

* cited by examiner

*Primary Examiner*—Hung Vu
(74) *Attorney, Agent, or Firm*—Antonelli, Terry, Stout & Kraus, LLP.

(57) ABSTRACT

A semiconductor device has p-channel field effect transistors disposed in a lattice shape. In order to generate compression stress in the channel of a p-channel field effect transistor, a long active region of a plurality of transistors is divided for each gate electrode and a sufficiently thin shallow trench isolation (STI) is formed between adjacent gate electrodes. The drain current characteristics can be improved.

7 Claims, 10 Drawing Sheets

VI – VI

VII—VII

VIII—VIII

IX–IX

| | x-DIRECTION STRESS (RELATIVE VALUE) |
|---|---|
| COMPARATIVE | 1 (COMPRESSION) |
| INVENTION | 1.7 (COMPRESSION) |

SEMICONDUCTOR DEVICE INCLUDING ACTIVE REGIONS AND GATE ELECTRODES FOR FIELD EFFECT TRANSISTORS, WITH A TRENCH FORMED BETWEEN THE ACTIVE REGIONS

BACKGROUND OF THE INVENTION

1. Field of the Invention

The present invention relates to a semiconductor device and, more particularly, to a semiconductor device having field effect transistors.

2. Description of the Related Art

The demands for improved performance for semiconductor devices such as memory LSIs have been on the upswing year after year especially with the recent developments of data communication apparatuses. Efforts to improve on transistor high-speed operation continue. This effort has also been ongoing for the peripheral circuit such as memory LSIs, CPUs and arithmetic and logical units, for example, to speed up n- and p-channel field effect transistors used in the peripheral circuit. Speeding up of the operation has been made mainly through miniaturization of the structure of semiconductor elements and backed up by the advancement of lithography techniques for forming semiconductor elements.

However, the minimum lithography size (minimum gate lithography size) presently required is equal to or longer than the wavelength of light used by lithography and, also, finer patterning is becoming difficult.

In order to overcome this difficulty and speed up the operation of field effect transistors, a method has been proposed by which strain is applied to silicon in the channel of a field effect transistor. According to a method disclosed in JP-A-11-340337, by utilizing the phenomenon that an electron mobility (effective mass) changes if strain is applied to silicon crystal, silicon germanium having a larger lattice constant than silicon, used as the material of an underlying film on which a field effect transistor is to be formed, and a silicon layer, epitaxially formed on the underlying layer to apply strain to silicon in a channel region, raise the mobility and speed up the operation of the transistor.

As one approach to speeding up the operation of field effect transistors of a recent semiconductor device, the above-described method has been studied with which silicon germanium material, having a larger lattice constant than silicon, is used as the material of an underlying film for silicon in the channel region to apply strain to the silicon and raise the mobility.

This method is, however, associated with the following problems and is no longer deemed practical. If material having a different lattice constant is epitaxially grown so as to obtain lattice matching, the energy of strain applied to the crystal becomes large and crystal dislocation occurs in the silicon film having a thickness equal to or greater than a critical film thickness. If silicon germanium not commonly used is introduced, it is necessary to use a new manufacture system for processes of manufacturing semiconductor devices such as LSIs and the manufacture cost rises.

Speeding up the operation of transistors is essential for a semiconductor device such as an LSI, as described above. However, there is a limit in lithography techniques. Although an increase in drain current has been studied by using methods different from lithography techniques, theses methods are associated with crystal defects and an increased cost because of a new manufacturing system.

High speed and an increase in drain current have been studied also for a peripheral circuit similar to memories and arithmetic and logical units. FIG. 5 shows the layout of p-channel field effect transistors disposed in a lattice shape and partially constituting a semiconductor device. This plan layout of p-channel field effect transistors is often used in a peripheral circuit of a CMOS device such as a PLL oscillator. However, as the integration degree becomes high, drain current of p-channel field effect transistors having this plan layout is reduced as compared to the design value and the total performance of the semiconductor device is degraded.

BRIEF SUMMARY OF THE INVENTION

It is an object of the invention to provide a semiconductor device with p-channel field effect transistors disposed in a lattice shape and having excellent drain current characteristics.

In order to achieve the above object, the invention provides a semiconductor device comprising: a semiconductor substrate; a plurality of gate electrodes constituting p-channel field effect transistors juxtaposed in and on the semiconductor substrate; and a plurality of active regions formed along a direction crossing a longitudinal direction of the gate electrodes, wherein: the gate electrode includes a first gate electrode and a second gate electrode having a longitudinal direction which is the same as the longitudinal direction of the first gate electrode, and the first and second gate electrodes are juxtaposed; the active region includes a first active region including an area corresponding to a portion of the first gate electrode and a second active region including an area corresponding to a portion of the second gate electrode; and a trench is formed between the first and second active regions, and a width of the trench in the longitudinal direction of the gate electrode is wider than a width of the trench in a direction crossing the longitudinal direction of the gate electrode. The direction crossing the longitudinal direction is, for example, a direction crossing the longitudinal direction at a right angle.

Alternatively, in p-channel field effect transistors having a plurality of juxtaposed gate electrodes and active regions juxtaposed along a direction perpendicular to the longitudinal direction of the gate electrodes, a trench having the direction perpendicular to the channel as its longitudinal direction is formed between adjacent active regions. The trench has a width of 0.25 μm or narrower, for example. A so-called shallow trench isolation film may be formed.

An insulating film is filled in the trench of the semiconductor device. The insulating film may be an oxide film such as a silicon oxide film having a lower conductivity than the substrate.

The width of the trench of the semiconductor device in the direction crossing the longitudinal direction is 0.25 μm or narrower. The direction crossing the longitudinal direction is, for example, a direction crossing the longitudinal direction at a right angle.

The semiconductor device may further comprise a third active region including an area corresponding to a portion of the first gate electrode, the third active region being positioned near the first active region via a field region in which an insulating film is buried, wherein a distance between the first and second active regions is set longer than a distance between the first and third active regions.

The insulating film has a lower conductivity than a peripheral silicon substrate. For example, a silicon oxide film may be used. It is preferable that the distance between the first and second active region is 0.25 μm or narrower and the distance between the first and third active regions is 0.25 μm or wider.

Alternatively, in p-channel field effect transistors having a plurality of juxtaposed gate electrodes and active regions juxtaposed for the gate electrodes, it is preferable to set the distance between adjacent active regions in the direction perpendicular to the channel to 0.25 μm or wider. Also, in p-channel field effect transistors having a plurality of juxtaposed gate electrodes and active regions juxtaposed along a direction perpendicular to the longitudinal direction of the gate electrodes, a shallow trench isolation film is disposed between adjacent active regions, the film having a width of 0.25 μm or narrower and the direction perpendicular to the channel as its longitudinal direction. The distance between adjacent active regions in the direction perpendicular to the channel may be set to 0.25 μm or wider.

The film of the semiconductor device deposited in the trench formed between the first and second active regions has a smaller content of nitrogen than the insulating film deposited in the field region between the first and third active regions.

In p-channel field effect transistors having a plurality of juxtaposed gate electrodes and active regions juxtaposed along a direction perpendicular to the longitudinal direction of the gate electrodes, the shallow trench isolation film having the direction parallel to the channel as its longitudinal direction has a larger content of nitrogen than that of a shallow trench isolation film having the direction perpendicular to the channel as its longitudinal direction.

The semiconductor device may further comprise n-channel field effect transistors corresponding to the p-channel field effect transistors, the n-channel field effect transistors having a plurality of gate electrodes juxtaposed and a plurality of active regions disposed in the direction crossing the longitudinal direction of the plurality of gate electrodes and crossing the plurality of gate electrodes.

In other words, the trench between adjacent active regions of the p-channel field effect transistors is not provided for the n-channel field effect transistors.

The semiconductor device may further comprise: a plurality of gate electrodes constituting n-channel field effect transistors formed in and on the semiconductor substrate; and a plurality of active regions formed in areas including regions corresponding to the gate electrodes, wherein: the gate electrode includes a third gate electrode and a fourth gate electrode having a longitudinal direction which is the same as the longitudinal direction of the first gate electrode, and the third and fourth gate electrodes are juxtaposed; the active region includes a third active region including an area corresponding to a portion of the third gate electrode and a fourth active region including an area corresponding to a portion of the fourth gate electrode; and a trench is formed between the third and fourth active regions, and the trench between the first and second active regions is narrower than the trench between the third and fourth active regions.

According to another aspect of the invention, there is provided a semiconductor device comprising: a semiconductor substrate; a plurality of gate electrodes constituting p-channel field effect transistors juxtaposed in and on the semiconductor substrate; and a plurality of active regions juxtaposed and having a direction crossing a longitudinal direction of the gate electrodes as a longitudinal direction of the active regions and crossing the gate electrodes, wherein: the gate electrode includes a first gate electrode and a second gate electrode having a longitudinal direction which is the same as the longitudinal direction of the first gate electrode, and the first and second gate electrodes are juxtaposed; the active region includes a first active region crossing portions of the first gate electrode and the second electrode; and the first active region formed between the first and second gate electrodes has a narrower region than a region where the first gate electrode is disposed. The width of the first active region may be a width along the longitudinal direction of the gate electrodes.

According to a further aspect of the present invention, there is provided a semiconductor device comprising: a semiconductor substrate; a plurality of gate electrodes constituting p-channel field effect transistors juxtaposed in and on the semiconductor substrate; and a plurality of active regions juxtaposed and having a direction crossing a longitudinal direction of the gate electrodes as a longitudinal direction of the active regions and crossing the gate electrodes, wherein: the gate electrode includes a first gate electrode and a second gate electrode having a longitudinal direction which is the same as the longitudinal direction of the first gate electrode, and the first and second gate electrodes are juxtaposed; the active region includes a first active region including an area corresponding to portions of the first and second gate electrodes; and a trench is formed in the semiconductor substrate between the first and second gate electrodes in the first active region. In the semiconductor device, an oxide film is filled in the trench.

Alternatively, in p-channel field effect transistors having a plurality of juxtaposed gate electrodes and active regions juxtaposed for the gate electrodes, a shallow trench isolation film may be formed in the active region between adjacent gate electrodes. A shallow trench isolation film may be inserted into the active region between adjacent gate electrodes in a concave shape.

In the semiconductor device, a first region having the trench in the semiconductor substrate and a second region having a contact hole are formed between the first and second gate electrodes in the first active region.

The semiconductor device may further comprise: a semiconductor substrate; a plurality of gate electrodes constituting n-channel field effect transistors juxtaposed in and on the semiconductor substrate; and a plurality of active regions juxtaposed and having a direction crossing a longitudinal direction of the gate electrodes as a longitudinal direction of the active regions and crossing the gate electrodes, wherein: the gate electrode includes a fourth gate electrode and a fifth gate electrode having a longitudinal direction which is the same as the longitudinal direction of the fourth gate electrode, and the fourth and fifth gate electrodes are juxtaposed; the active region includes a second active region crossing a portion of the fourth and fifth gate electrodes; and the trench is not formed or a trench wider than the trench is formed, between the fourth and fifth gate electrodes in the second active region.

Alternatively, the narrow region may not be formed in the second active region.

According to still another aspect of the present invention, there is provided a semiconductor device comprising: a semiconductor substrate; a plurality of gate electrodes constituting transistors formed in and on the semiconductor substrate; and a plurality of active regions formed in areas including regions corresponding to the gate electrodes, wherein: the gate electrode includes a first gate electrode and a second gate electrode having a longitudinal direction which is the same as the longitudinal direction of the first gate electrode, and the first and second gate electrodes are juxtaposed; the active region includes a first active region including an area corresponding to a portion of the first gate electrode and an area corresponding to a portion of the second gate electrode, a second active region including an area corresponding to another portion of the first gate electrode, and a third active region including an area corresponding to another portion of the second gate electrode; and transistors constituting a two-input NAND circuit are formed in the first to third active regions, and a trench is formed in the semiconductor substrate between the second and third active regions. It is preferable that n-channel field effect transistors are formed in the first active region and p-channel field effect transistors are formed in the second and third active regions.

In the two-input NAND circuit, the width of the active area in the direction crossing the longitudinal direction of the gate electrode (in the direction of source/drain current), i.e., the distance between the trenches at the ends of the active region, is set wider for n-channel field effect transistors than for p-channel field effect transistors. The first active region is wider than the second or third active region.

In a semiconductor device having a plurality of two-input NAND circuits, it is assumed that a first two-input NAND circuit having p-channel field effect transistors is disposed adjacent to a second two-input NAND circuit having p-channel field effect transistors. A region (called a dummy active region) having a trench in the substrate is formed in the active region of, for example, the first two-input NAND circuit having p-channel field effect transistors by not forming transistors in this active region. The active region of the p-channel field effect transistors of the first two-input NAND circuit is disposed via the dummy active region adjacent to the second two-input NAND circuit having p-channel field effect transistors.

The width of a trench in the substrate formed between the active region of the p-channel field effect transistors and the dummy active region is set to 0.25 µm or narrower. The width of a trench between the second and third active regions is set to 0.25 µm or narrower.

In adjacent two-input NAND circuits, a trench formed between the active region of one two-input NAND circuit having n-channel field effect transistors and the active region of the other two-input NAND circuit is set wider than the trench formed between the active regions of p-channel field effect transistors.

Other objects, features and advantages of the invention will become apparent from the following description of the embodiments of the invention taken in conjunction with the accompanying drawings.

DETAILED DESCRIPTION OF THE INVENTION

Figure 1:
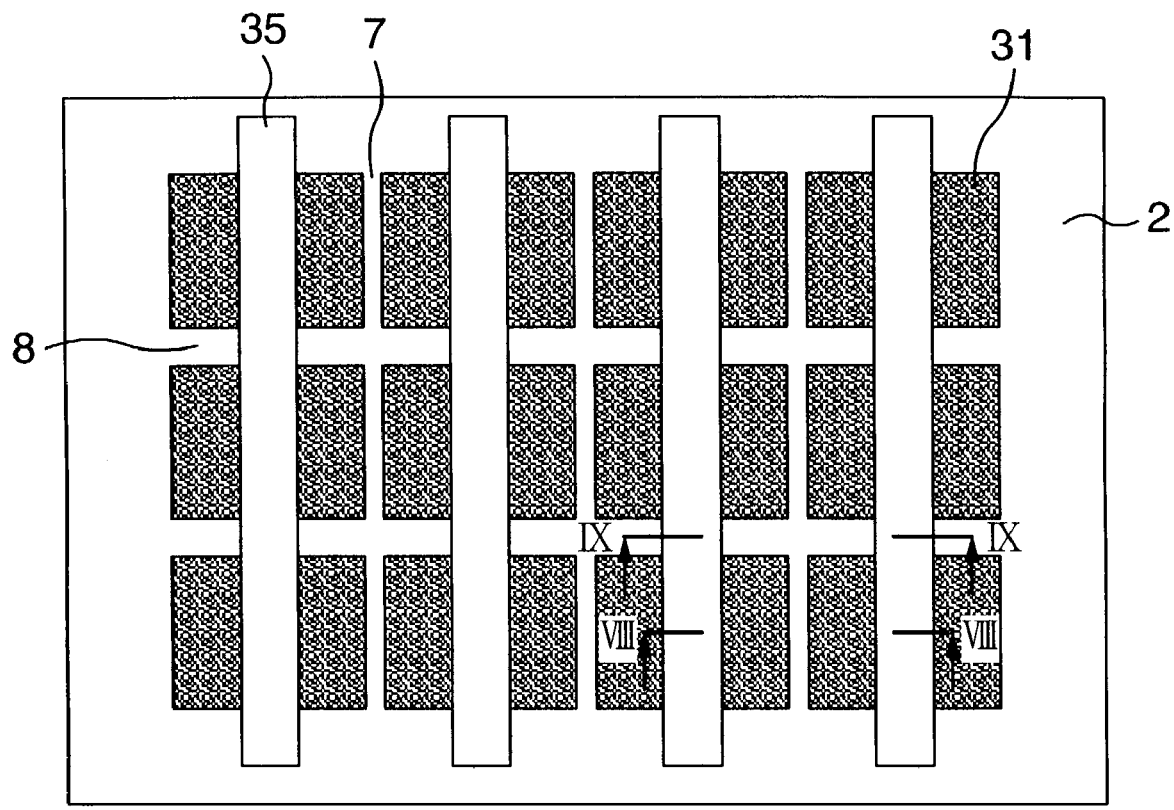
FIG. 1 is a schematic diagram showing a plan pattern of a semiconductor device according to a first embodiment of the invention.
Figure 5:
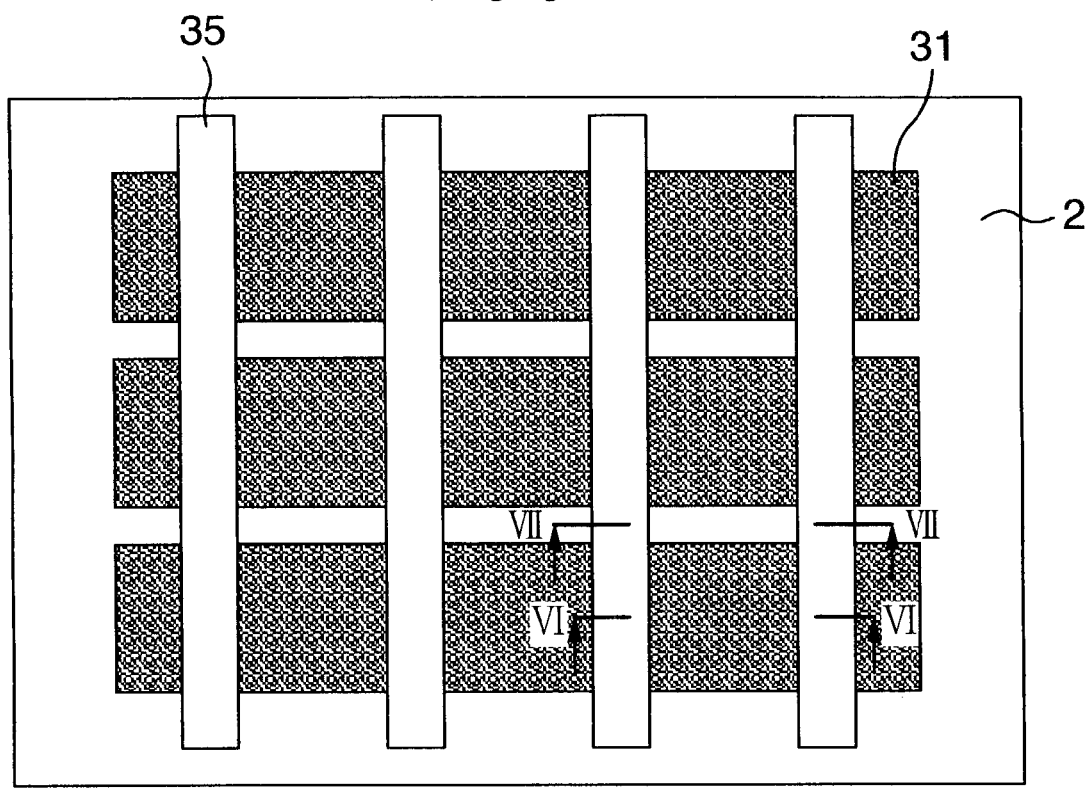
FIG. 5 is a schematic diagram showing a plan pattern of a comparative semiconductor device.
Figure 6:
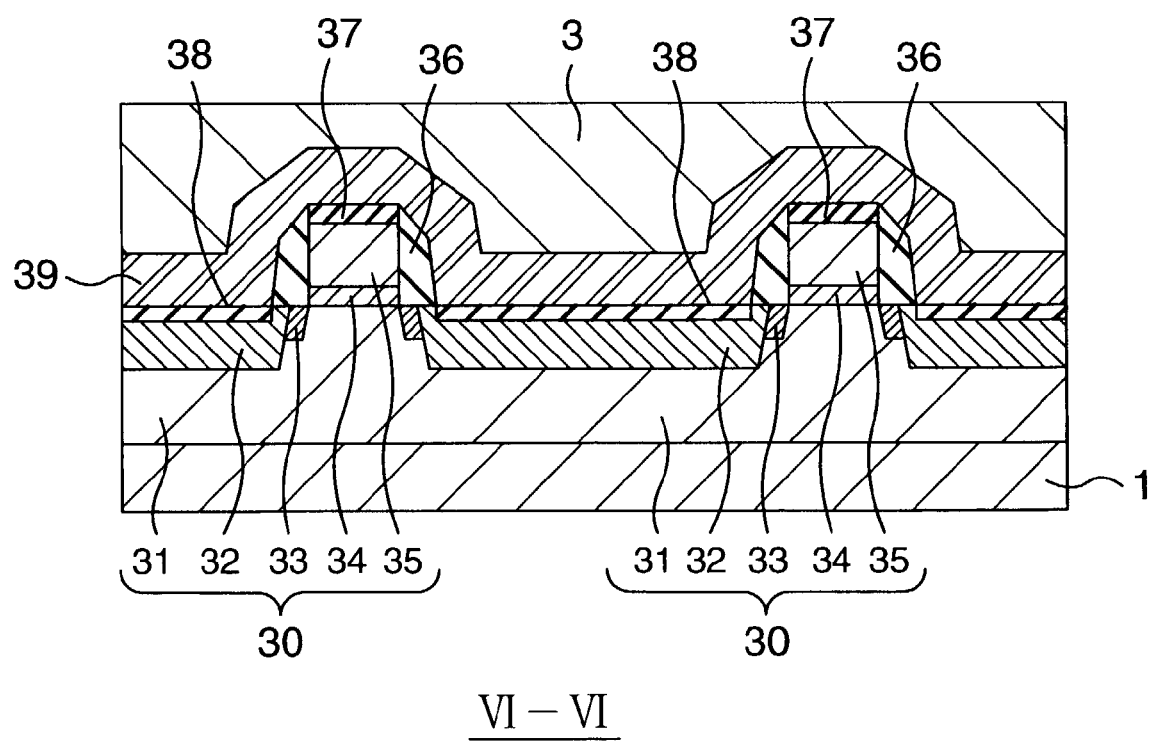
FIG. 6 is a cross sectional view of the comparative semiconductor device taken along an arrow line VI—VI shown in FIG. 5.
Figure 7:
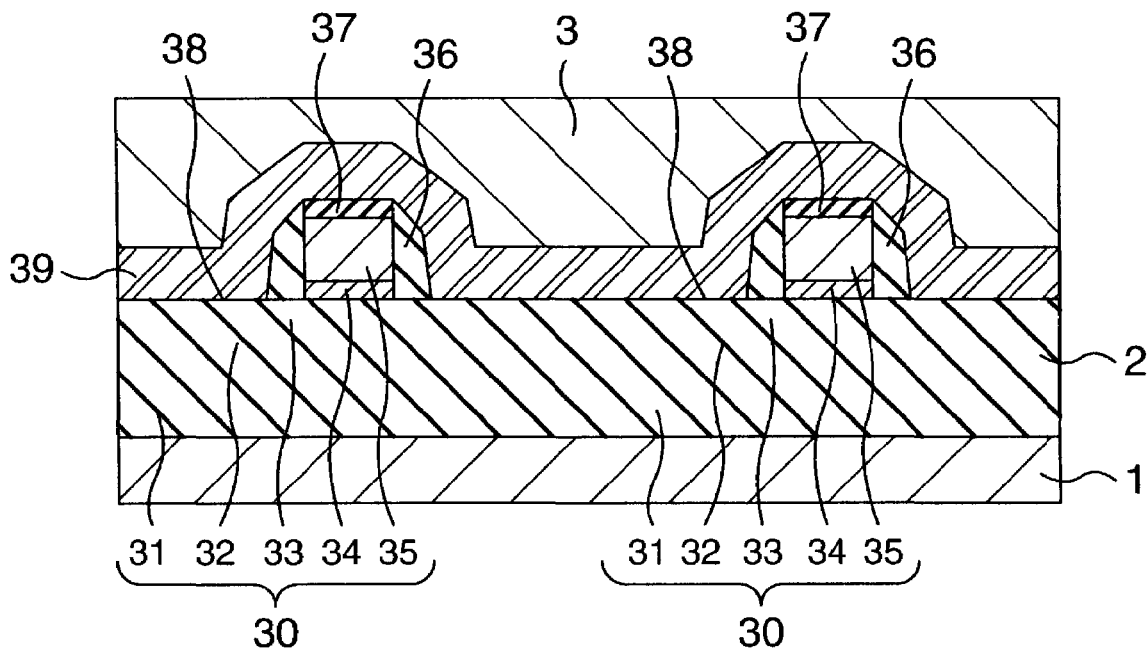
FIG. 7 is a cross sectional view of the comparative semiconductor device taken along an arrow line VII—VII shown in FIG. 5.
Figure 8:
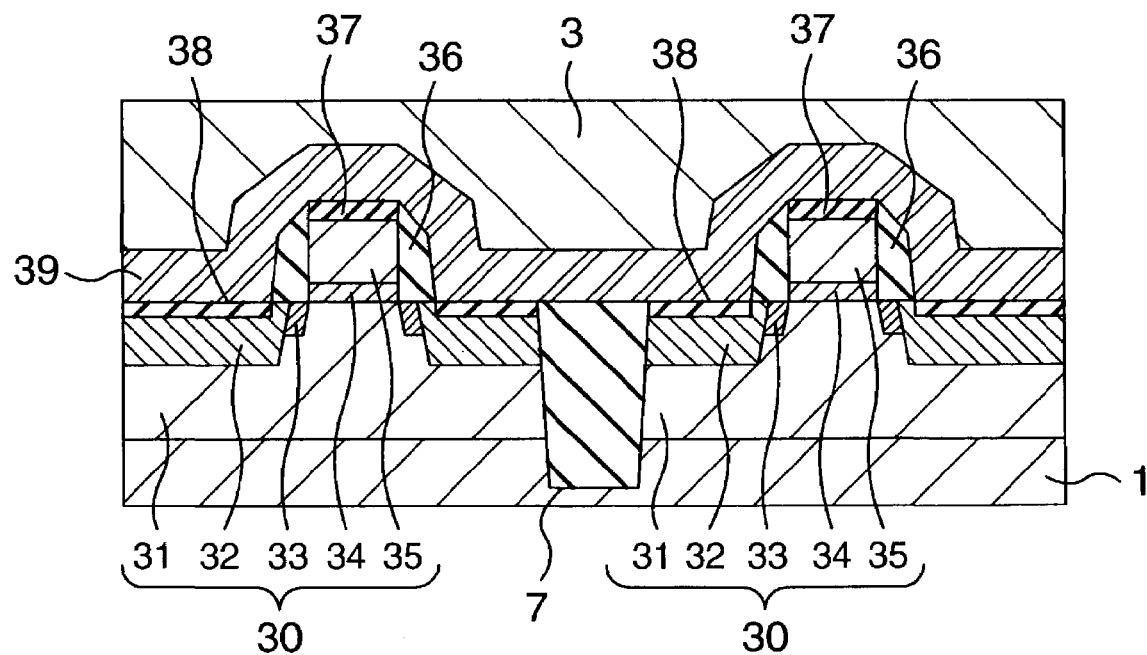
FIG. 8 is a cross sectional view of the semiconductor device of the first embodiment taken along an arrow line VIII—VIII shown in FIG. 1.
Figures 9, 10:
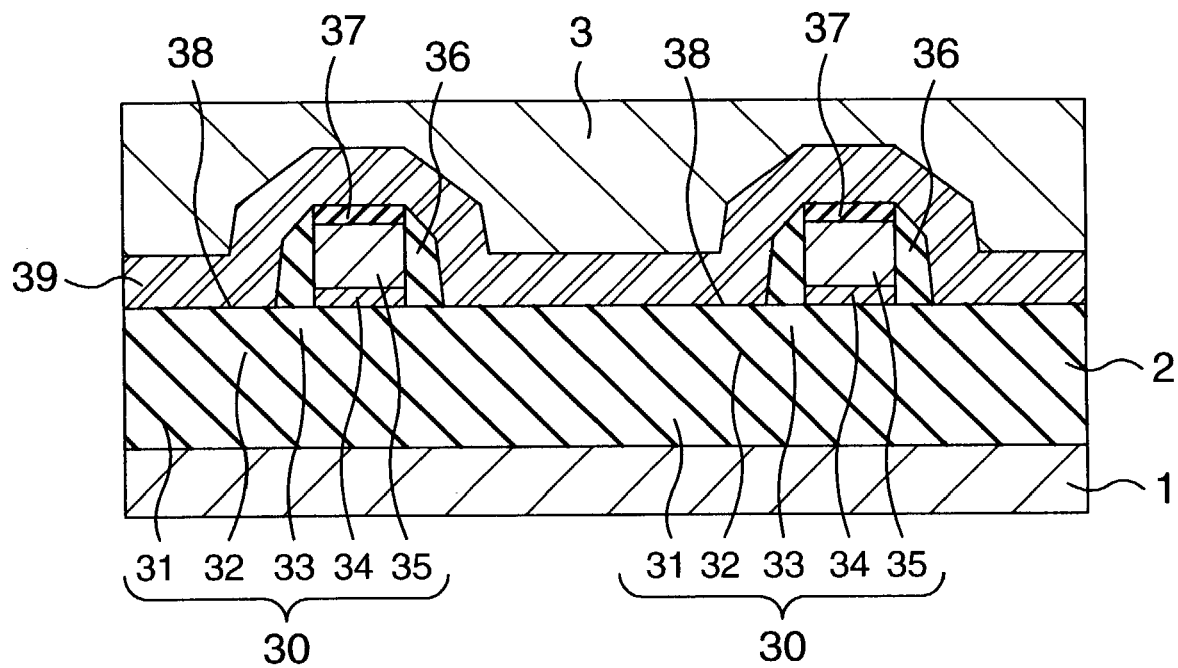
FIG. 9 is a cross sectional view of the semiconductor device of the first embodiment taken along an arrow line IX—IX shown in FIG. 1.
FIG. 10 is a diagram showing a difference of stress values between the comparative semiconductor device and the semiconductor device of the first embodiment.
Figure 11:
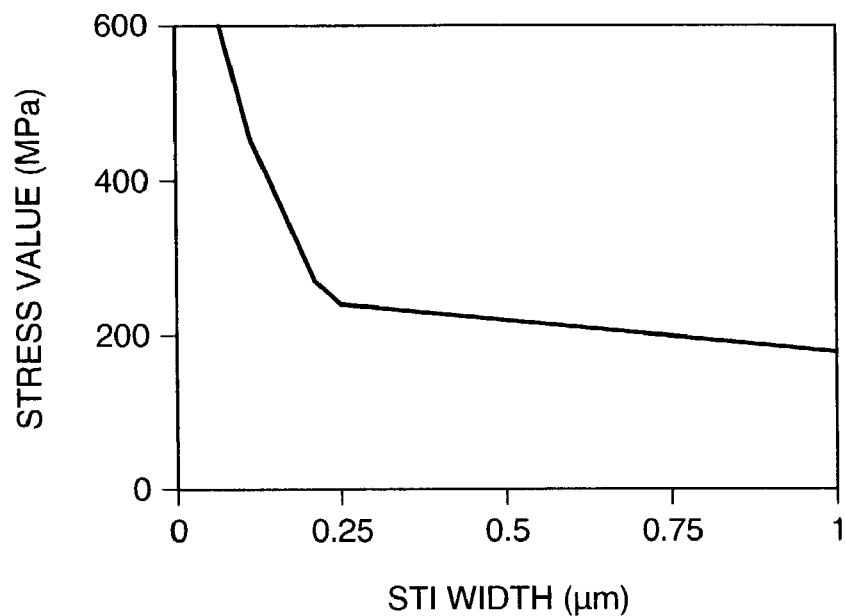
FIG. 11 is a graph showing the relation between a stress and an STI trench width.

A first embodiment of the invention will be described with reference to FIG. 1 and FIGS. 5 to 9. FIG. 5 is a schematic diagram showing the plan layout of a semiconductor device as a comparative example. FIG. 1 is a schematic diagram showing a plan layout of a semiconductor device according to the first embodiment. FIGS. 6 and 7 are cross sectional views of the comparative semiconductor device taken along arrow lines VI—VI and VII—VII shown in FIG. 5, respectively. FIGS. 8 and 9 are cross sectional views of the semiconductor device of the first embodiment taken along arrow lines VIII—VIII and IX—IX shown in FIG. 1, respectively. FIG. 11 is a graph showing the analysis results of the STI trench width dependency of stress.

The plan layout of the comparative semiconductor device is shown in FIG. 5. The plan layout shows a plurality of p-channel field effect transistors constituting the semiconductor device. A plurality of gate electrodes 35 of p-channel field effect transistors are juxtaposed, the longitudinal direction of the gate electrode being the up/down direction in FIG. 5 (y-direction). A plurality of active regions 31 extend crossing the gate electrodes 35, the longitudinal direction of the active region being the right/left direction in FIG. 5 (x-direction). Source/drain regions 32 and 33 corresponding to the gate electrode 35 are formed in the active region 31. The periphery of the active region 31 is surrounded by an STI (shallow trench isolation) oxide film 2. This plan layout of p-channel field effect transistors is often used by a CMOS device peripheral circuit such as a PLL oscillator.

As the integration degree becomes high, drain current of p-channel field effect transistors having this plan layout is reduced as compared to the design value and the total performance of the semiconductor device is degraded. The inventors have achieved, as a result of their investigative efforts, an improved plan layout capable of increasing drain current by utilizing stress.

FIG. 1 shows the plan layout of a semiconductor device of an example first embodiment of the present invention. The active region 31 of the comparative example shown in FIG. 5 and having the right/left direction (x-direction) as its longitudinal direction is divided for each gate electrode 35 by forming a narrow trench between adjacent gate electrodes and embedding an oxide film or a nitride film in this trench. For example, the width of the shallow trench is set to 0.25 µm or narrower. Although the width is set preferably narrow, it is easy to set the width to about 0.1 µm or wider from the viewpoint of manufacture processes. This trench may have the structure similar to STI. In this embodiment, although the STI (shallow trench isolation) oxide film is used, if an SOI substrate or the like is used, a deep trench reaching the oxide film of the SOI substrate may be formed. In this specification, although the film is called STI on the basis of classification of processes, the narrow STI is sufficient if it can give compression stress and does not aim at element separation. Therefore, this element separation function (of electrically insulating elements) may be insufficient. For example, the trench formed between adjacent gates may not have a trapezoidal trench cross section which is caused by insufficient trench formation; rather, it has a triangular trench cross section. The width of the trench bottom may be narrower than the trench (i.e., element separation trench) crossing the gate electrodes. This is preferable because the amount of oxide to be embedded in the trench can be reduced. Material to be embedded in the trench is any material such as oxide and nitride which does not change the transistor characteristics when diffused in a silicon substrate. Both oxide and nitride or both oxide and polysilicon may be embedded. The effects can further be expected if a silicon film is partially embedded in the trench of STI 7 because the silicon film is oxidized and subjected to volume expansion. If a silicon film is embedded only in STI 7 and an oxide film is embedded in the trench of STI 2 in one area, the drain current of p-channel field effect transistors formed in this area can be increased and n-channel field effect transistors formed in the other area can be prevented from being lowered.

Since volume expansion occurs because the inside of the trench STI 7 is oxidized, a strong compression stress can be applied along the x-direction. Since compression stress is applied under the gate electrode 35 along the x-direction, the drain current of a p-channel field effect transistor can be increased and the performance of the transistor can be prevented from being lowered. Since the gate electrode area of a transistor can be reduced in correspondence with an increase in the drain current, the area of the semiconductor device having the embodiment plan layout of FIG. 1 can be reduced.

FIG. 10 shows x-direction stresses in the silicon substrate under the gate electrode 35, the stress being estimated by stress analysis using a finite element method. It can be understood that according to the invention, generated compression stress is as large as about 1.7 times of that of the plan layout of the comparison semiconductor device. With the plan layout of the comparative example, a silicide layer 38 is formed on the surface of the active region 31 of the silicon substrate. There is, therefore, tensile stress of the silicide layer and the compression stress in the x-direction weakens. In contrast, in this embodiment, since the narrow shallow trench isolation (STI) 7 is formed, compression stress in the x-direction can be increased.

The trench width of the narrow shallow trench isolation (STI) 7 is desired to be as narrow as possible, and is preferably at about the minimum line width. FIG. 11 shows the relation between a compression stress and an STI trench width. The compression stress obtained is the compression stress in the silicon substrate under the gate electrode along the x-direction from which compression stress the stress by the gate electrode is removed. As seen from FIG. 11, if the STI trench width is wide, the compression stress is negligibly small, whereas as the trench width becomes narrower, the compression stress abruptly increases to the extent of a MPa order. In the device before development of the 0.25 μm generation (gate electrode with of 0.25), even if STI is disposed between adjacent gates, the effects of increasing drain current are small. On the other hand, there is the demerit that the chip size becomes large corresponding to the area occupied by STIs. The invention has the merit only for the devices having the minimum line width of 0.25 μm or narrower and only because the element separation structure changed from the LOCOS structure to the STI structure.

FIGS. 8 and 9 are cross sectional views of the semiconductor device of the first embodiment taken along arrow lines VIII—VIII and IX—IX shown in FIG. 1. Each of p-channel field effect transistors in the plan layout of the embodiment has a structure 30 including p-type source/drain regions 32, 33 formed in an n-type well 31, a gate insulating film 34, and a gate electrode 35. Silicide layers 37 and 38 are formed on the upper surfaces of the gate electrode 35 and source/drain regions 32, 33. These transistors are insulated from each other by a shallow trench isolation made of a silicon oxide film ($SiO_2$) or a silicon nitride film (SiN). In the region opposite to the source/drain region 32, 33 relative to the gate electrode, a corresponding source/drain region although not numbered in FIGS. 8 and 9 is formed to constitute the transistor. The source/drain region means either the source or drain. It is obvious that if the one region is the source, the opposite region relative to the gate electrode is the drain.

In the first embodiment of the invention, the plan layout is devised by disposing the narrow shallow trench isolation (STI) 7. By utilizing volume expansion of side wall oxidation of the shallow trench isolation (STI) 7, stress is changed to compression stress in parallel to the channel under the gate electrode of the p-channel field effect transistor. The other constituent elements may have the structures and materials different from those of the first embodiment.

For example, the gate oxide film 34 may be a dielectric film such as a silicon oxide film ($SiO_2$), a silicon nitride film (SiN), a titanium oxide film ($TiO_2$), a zirconium oxide film ($ZrO_2$), a hafnium oxide film ($HfO_2$) and a tantalum pentaoxide film ($Ta_2O_5$) or a lamination structure of these films. The gate electrode 35 may be, for example, a polysilicon film, a metal film made of tungsten (W), platinum (Pt), ruthenium (Ru) or the like, or a lamination structure of these metals.

On the side walls of the gate insulating film 34, gate electrode 35, silicide layers 37 and 38, side wall spacers 36 are formed which are made of a silicon nitride film (SiN) or a silicon oxide film ($SiO_2$).

A stress control film 39 is formed above the p-channel field effect transistor. An interlayer insulating film 3 is formed on the stress control film 39, the interlayer insulating film being made of, for example, a boron-doped phospho silicate glass film (BPSG), a spin-on-glass film (SOG), a tetra-etyl-ortho-silicate film (TEOS), or a silicon oxide film which is formed by chemical vapor deposition (CVD) or sputtering.

P-channel field effect transistors formed on and in the silicon substrate 1 are electrically connected by contact plugs, wiring lines and the like to form a desired circuit.

In the first embodiment shown in FIGS. 1, 8 and 9, contact plugs, wiring lines and the like are omitted therefrom, and they are also omitted from the showings in the other embodiments.

Although n-channel field effect transistors are, basically, formed by a method similar to the method of forming p-channel transistors, shallow trenches are not formed between adjacent gate electrodes of the n-channel field effect transistors. Further, even if active regions are continuous between gate electrodes and a p-channel field effect transistor has a narrow active region, a narrow active region of an n-channel field effect transistor is made wider than the narrow active region of the p-channel field effect transistor or the narrow active region of the n-channel field effect transistor is not formed.

For the p-channel field effect transistors constituting the plan layout of the embodiment, it is desired that the stress in the stress control film 39 be compression stress and that stress in the side wall spacers 36 be compression stress.

Even if these stresses are tensile stress, it is desired that these stresses take as small a value as possible. In order to realize this, a silicon nitride film (SiN) or a silicon oxide film (SiO$_2$) is, preferably, formed by CVD using plasma.

The present inventors measured the stress dependency of drain current of a field effect transistor and have found that n- and p-channel field effect transistors have different stress dependencies.

In this specification, silicon nitride and silicon oxide are represented by SiN and SiO$_2$, respectively.

Figure 2:
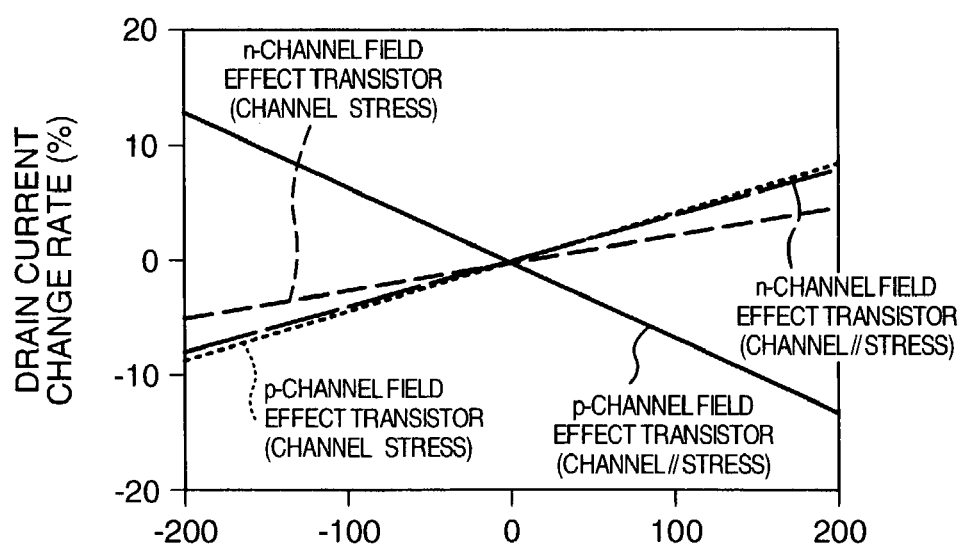
FIG. 2 is a graph showing the experiment results of a stress dependency of drain current of n- and p-channel field effect transistors.

FIG. 2 is a graph showing the experiment results of the stress dependency of drain current of n- and p-channel field effect transistors.

The experiment results shown in FIG. 2 were obtained by making stress load experiments of transistors whose drain current flows in the Si (001) plane in parallel to the axis <110>. The gate length of each evaluated field effect transistor was 0.2 μm. Measured stresses include: uniaxial stress in the channel plane parallel to drain current flowing in the channel of the field effect transistor (stress parallel to channel); and uniaxial stress in the channel plane perpendicular to drain current (stress perpendicular to channel). The plus sign of stress represents tensile stress, and the minus sign represents compression stress.

As seen from FIG. 2, in the n-channel field effect transistor, as the tensile stress increases, the drain current increases (about 4% per 100 MPa in the case of stress parallel to the channel, about 2% per 100 MPa in the case of stress perpendicular to the channel).

In the p-channel field effect transistor, although as the tensile stress increases, the drain current perpendicular to the channel increases (about 4% per 100 MPa), the drain current parallel to the channel decreases (about 7% per 100 MPa).

It can be considered from these results that in the case of biaxial stresses in the channel plane, as the tensile stress increases, the drain current increases irrespective of the absolute values in the case of the n-channel field effect transistor, whereas as the compression stress increases, the drain current increases if the biaxial stresses having the same absolute value are applied.

The stress and strain are proportional in elastic deformation. According to the experiment results described above, for example, if tensile stress parallel to the channel is applied to the n-channel field effect transistor, the drain current increases. The reason for this may be ascribed to that in which crystal lattices of silicon constituting the channel are strained along the tensile direction in the channel plane more than before the application of stress so that the electron mobility becomes higher.

More specifically, the present inventors have clarified that the drain current characteristics of n- and p-channel field effect transistors are dependent upon the direction and absolute value of strain generated in crystal lattices of silicon constituting the channel. Strain in silicon crystal can be measured with a TEM, electron diffraction, Raman spectroscopy or the like.

In the lamination structure of a multilevel film used by a transistor or the like, thermal stress is generated by a difference of coefficients of linear expansion of materials, intrinsic stress is generated by a difference of lattice constants, a film contraction during crystallization or the like, and residual stress is generated in the internal structure. The generation of field effect transistors becoming micro fine year after year is, generally, represented by the gate length.

The present inventors conducted stress analysis of a field effect transistor structure and have clarified that as the gate lithography size becomes smaller, stress generated in the internal structure becomes larger because of a micro fine structure and use of new material. Field effect transistors, particularly after the gate length scale-down thereof to the 0.25 μm generation (gate electrode width of 0.25 μm or narrower), have stresses such as oxidation induced stress by shallow trench isolation (STI), stress induced by silicidation, and stress by crystallization of polysilicon.

Figure 3:
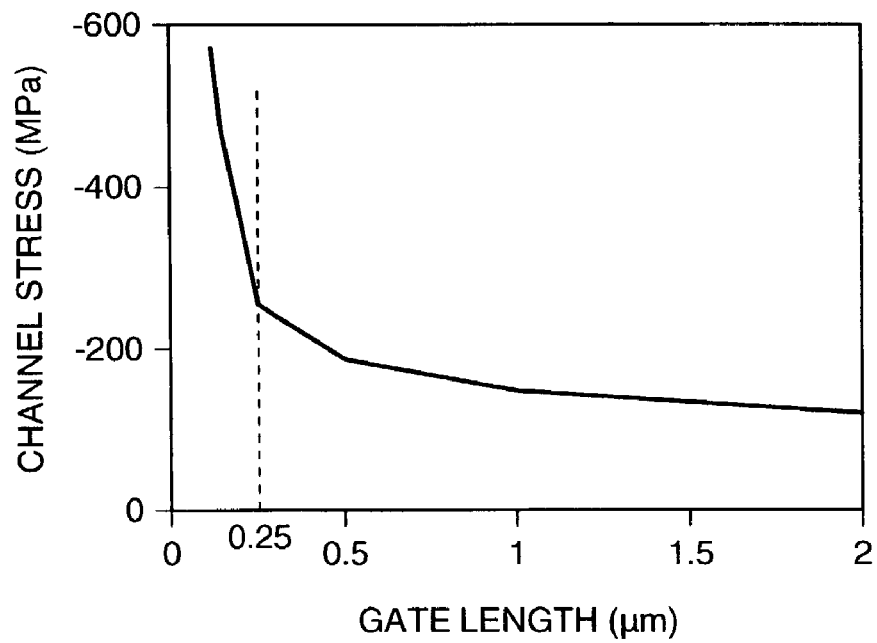
FIG. 3 is a graph showing the degrees of increase in stress of field effect transistors in respective generations.

FIG. 3 is a graph showing the stress in the channel of a field effect transistor in each gate length generation, the stress being analyzed by the finite element method. As seen from FIG. 3, stress generated in the channel under the gate of a transistor in the 2 μm generation, having a relatively long gate length (a gate electrode width of about 2 μm), is small. Stress of a transistor in the generation having a gate length of 0.25 μm or shorter becomes abruptly large. Stress of a transistor in the 0.1 μm generation (having a gate electrode width of about 0.1 μm) is about a three-fold of that in the 2 μm generation.

There are many studies on the influence of field effect transistor stress upon the transistor characteristics. For example, there are studies on the stress dependency upon the mutual conductance which is one of the characteristics of a field effect transistor (Akemi Hamada, et al., IEEE Trans. Electron Devices, vol. 38, No. 4, pp. 895–900, 1991).

The problem that the field effect transistor characteristics change with stress did not exist in the past. This can be ascribed to that in which the field effect transistor before the 0.25 μm generation, i.e., having a gate electrode width of 0.25 μm or wider, has a low sensitivity to stress generated in the transistor structure. The problem to be solved by the invention becomes conspicuous only after the gate electrode size becomes 0.25 μm or narrower.

Figure 4:
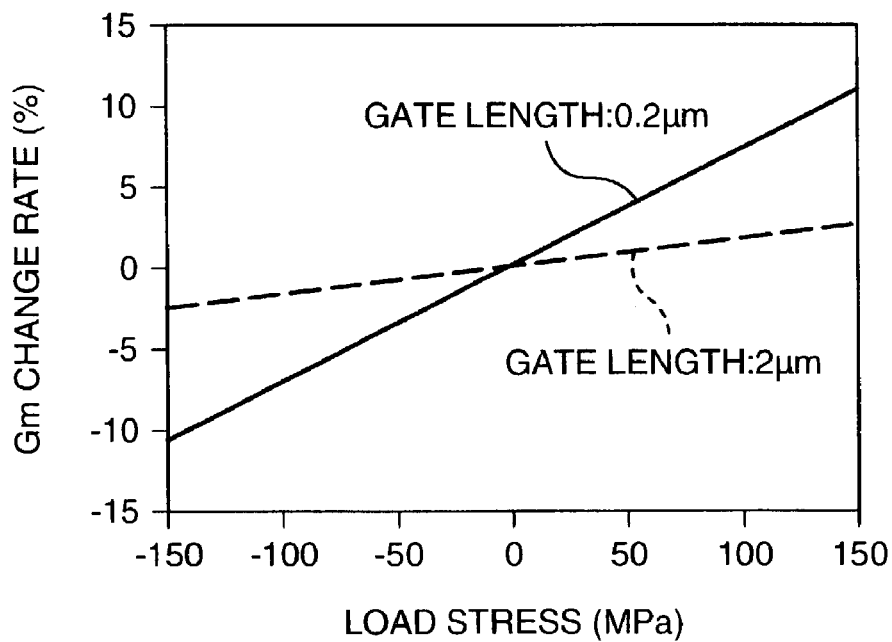
FIG. 4 is a graph showing the experiment results of a stress dependency of mutual conductance (Gm) of field effect transistors in respective generations.

FIG. 4 shows the experiment results (gate length: 0.2 μm) of the stress dependency of the mutual conductance Gm conducted by the present inventors as compared to the experiment results (gate length: 2 μm) of Gm shown in the above-described paper (Akemi Hamada, et al., IEEE Trans. Electron Devices, vol. 38, No. 4, pp. 895–900, 1991).

The comparison shown in FIG. 4 was made by using a stress load parallel to the channel applied to an n-type field effect transistor. As compared to the transistor in the generation having a gate length of 2 μm, the transistor in the gate length 0.2 μm generation has about a four-fold rate of the Gm dependency upon stress. It means that the sensitivity of the transistor characteristics relative to stress becomes higher as the transistor generation advances.

According to the stress analysis, the stress distribution in the substrate depth direction formed in the channel of a Si substrate of a field effect transistor is concentrated near the gate electrode. The diffusion region of a transistor in the 0.1 μm generation having a short gate length is formed in a shallower region near the substrate surface than that of a conventional transistor having a longer gate length. It can be assumed, therefore, that the active region of the transistor in the 0.1μ generation becomes likely to be influenced by stress.

The present inventors made the stress analysis of a field effect transistor structure by the finite element method, and made the sensitivity analysis as to how the materials of the field effect transistor and the material of the nearby elements influence stress in the channel through which drain current flows.

With these analyses, the present inventors have clarified that the layout of the gate electrode, a shallow trench isolation (STI) oxide film, SAC-SiN silicide layers and the like, i.e., the plan pattern, influences greatly the stress in the channel. Of these elements, particularly STI has a large influence because its volume expands when the trench is oxidized and generates a large compression stress. By paying attention to the plan pattern of STI, it has been found that drain current can be changed greatly. This phenomenon appears only after the semiconductor device becomes micro fine, and is negligible in a semiconductor device having a gate electrode width of 0.25 μm or wider.

Figure 12:
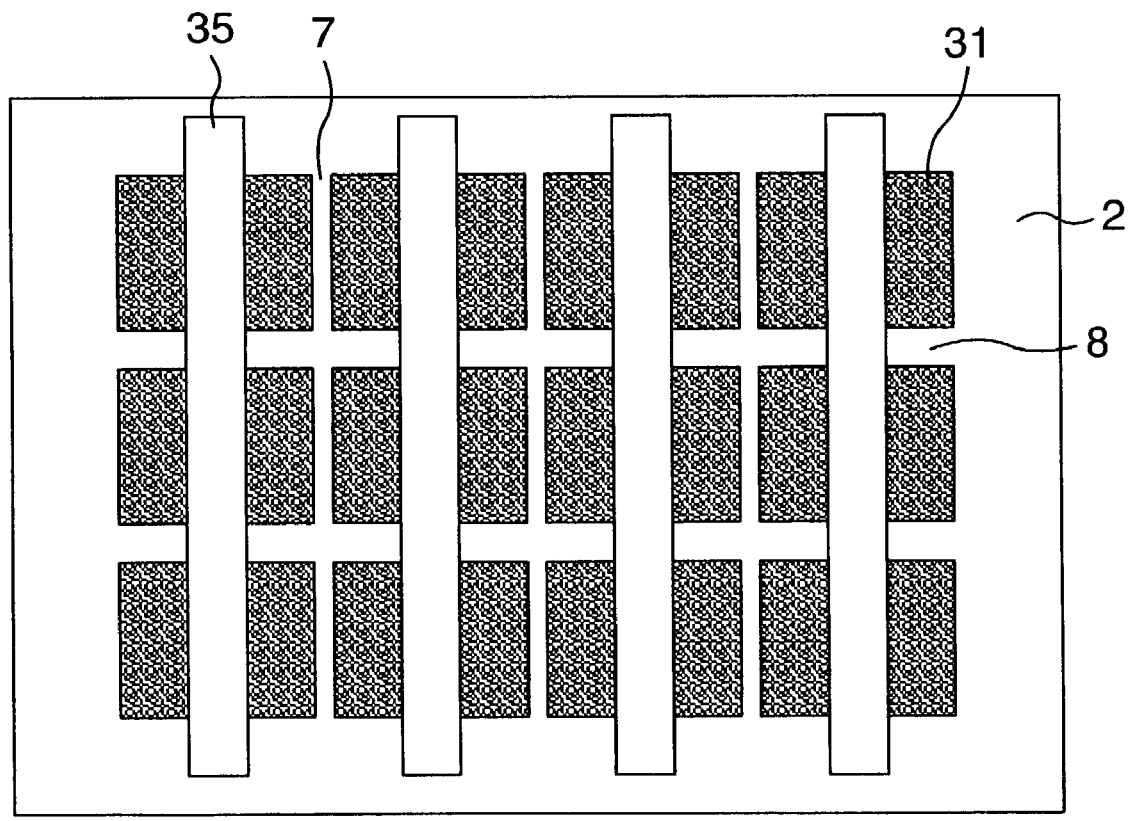
FIG. 12 is a schematic diagram showing a plan pattern of a semiconductor device according to a second embodiment of the invention.

A second embodiment of the invention is shown in FIG. 12. Similar to the first embodiment, in a p-channel field effect transistor, the active region having the right/left direction (x-direction) in FIG. 12 is divided for each gate electrode and a narrow shallow trench isolation is disposed adjacent gate electrodes. Although the second embodiment is basically similar to the first embodiment shown in FIG. 1, in the second embodiment, the width of a shallow trench isolation (STI) 8 between adjacent active regions in the up/down direction (y-direction) is set to 0.25 μm or wider. The compression stress in the y-direction can be lowered greatly so that the drain current of the p-channel field effect transistor can be improved. The performance of the field effect transistor can be further prevented from being degraded more than the first embodiment. Alternatively, the gate electrode area of the transistor can be reduced by an amount corresponding to an increase in drain current. Therefore, the area of the semiconductor device including the plan layout can be reduced more than the first embodiment. The trenches disposed along the width direction of the gate electrode, i.e., across the gate electrodes, can be formed both for the p- and n-channel field effect transistors. There is a tendency that if an oxide film is filled in the trench, compression stress is generated. It is, therefore, preferable to widen the shallow trench isolation formed along the y-direction more than the shallow trench isolation formed along the x-direction to lower compression. Although the upper width limit can be determined by a chip area, it is suitable to set the width to about 0.5 μm or narrower from the viewpoint of element integration.

Figure 13:
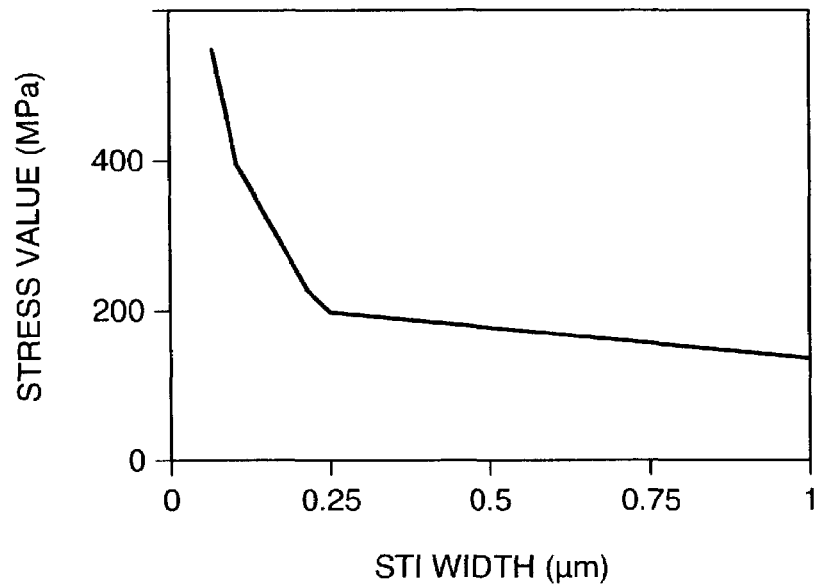
FIG. 13 is a graph showing the relation between stress and an STI trench width.

FIG. 13 is a graph showing the relation between the width of the shallow trench isolation (STI) 8 between active regions along the up/down direction (y-direction) and the stress along the y-direction in the silicon substrate under the gate electrode. As seen from FIG. 13, as the width of the shallow trench isolation (STI) 8 along the y-direction is set to 0.25 μm or narrower, the stress abruptly increases. Conventional semiconductor devices have a wider STI and a sufficiently lower stress and, as described earlier, have a low sensitivity of drain current relative to stress. For these reasons, no problem occurred in the past. A semiconductor device miniaturized (i.e., scaled-down) to about the 0.25 μm rule has an increased sensitivity relative to stress and a large stress. Therefore, the above-described problem appears.

Even with a semiconductor device miniaturized to about the 0.25 μm rule, drain current can be increased more than the first embodiment by setting the width of STI along the y-direction to 0.25 μm or wider. The performance can be prevented from being lowered.

Figure 14:
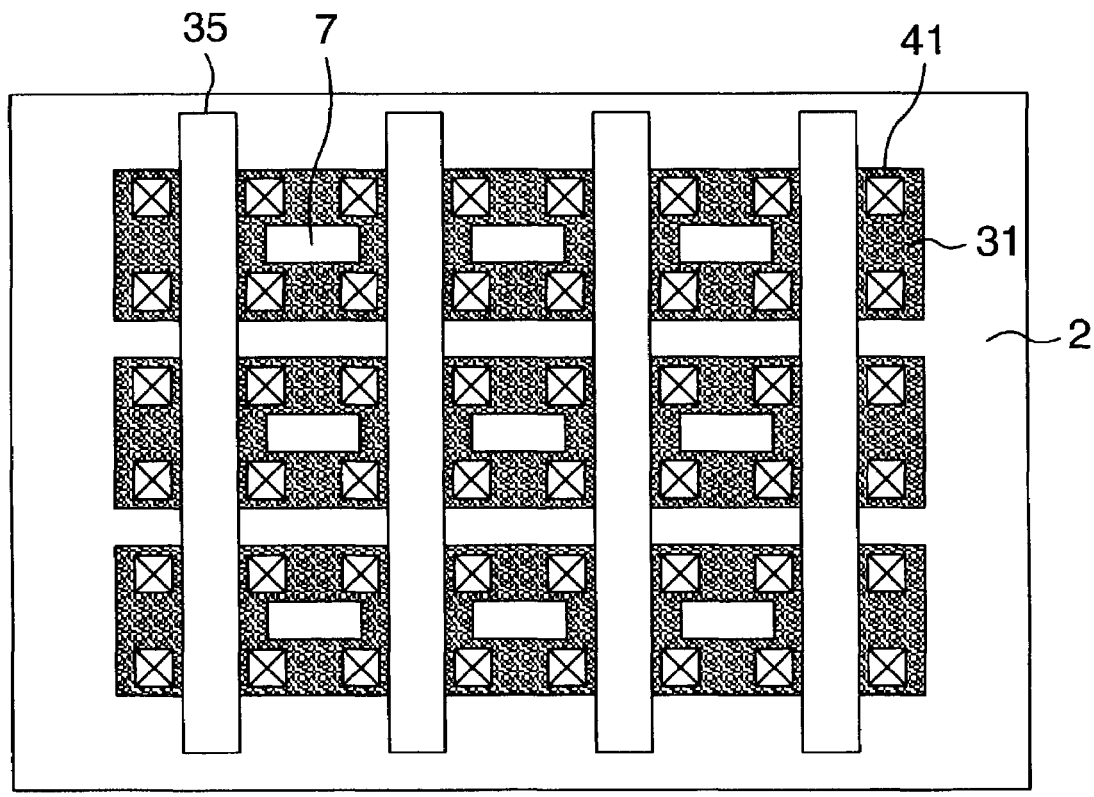
FIG. 14 is a schematic diagram showing a plan pattern of a semiconductor device according to a third embodiment of the invention.

A third embodiment of the invention is shown in FIG. 14. In the third embodiment, a plurality of gate electrodes 35 having the same direction as their longitudinal direction are disposed, a plurality of active regions 31 having the direction crossing (e.g., substantially crossing at a right angle) the gate electrodes as their longitudinal direction are disposed, and a plurality of narrow shallow trench isolation pieces (STIs) 7 having the right/left direction (x-direction) in FIG. 14 are disposed in an area different from the area where contact plugs 41 are formed in the active regions. In this manner, the narrow shallow trench isolation (STI) 7 is disposed spaced apart from contact plugs.

A narrow active region is formed by the trench disposed in the active region between adjacent gate electrodes. In this manner, the narrow active region is formed in the active region between one transistor and another transistor formed in the same active region.

As compared to the first and second embodiments, the distance between the gate electrodes in the x-direction can be shortened. Similar to the first and second embodiments, compression stress can be applied to the active region under the gate electrode in the x-direction so that drain current of the p-channel field effect transistor can be increased and the performance can be prevented from being degraded. Alternatively, the gate electrode area of the transistor can be reduced by an amount corresponding to an increase in drain current. Therefore, the area of the semiconductor device including the plan layout can be reduced more than the first embodiment.

Figure 15:
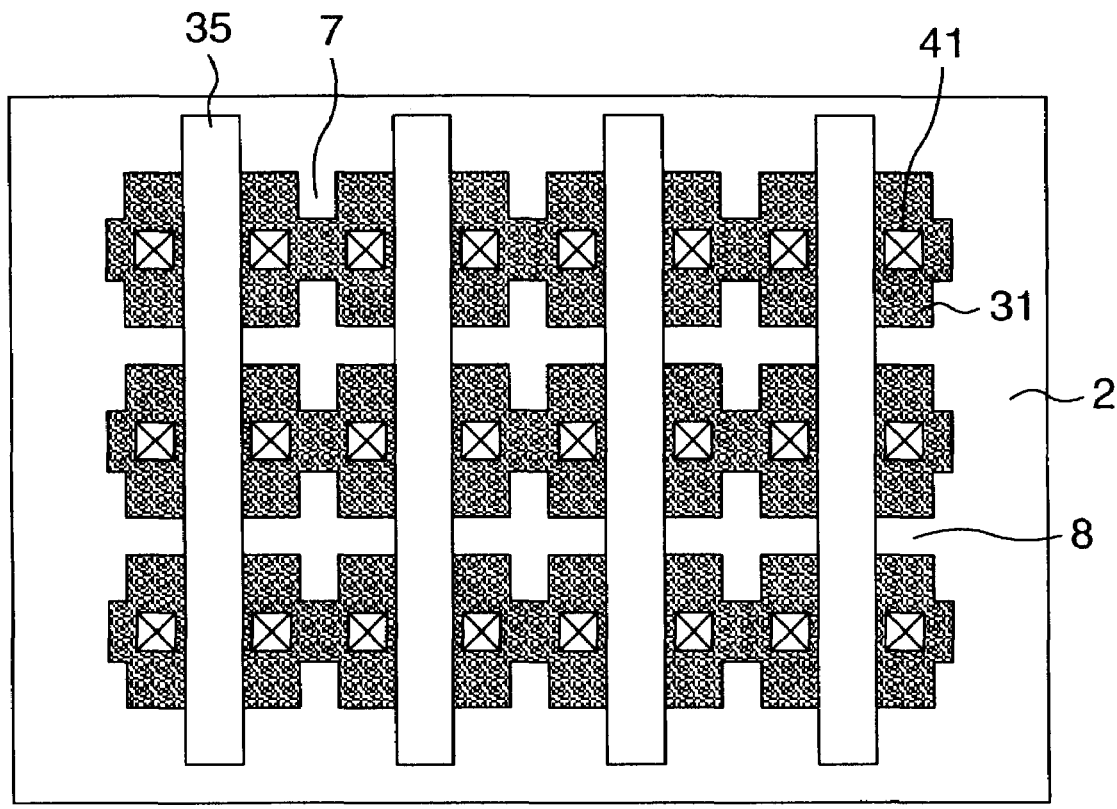
FIG. 15 is a schematic diagram showing a plan pattern of a semiconductor device according to a fourth embodiment of the invention.

FIG. 15 shows a fourth embodiment of the invention. In the fourth embodiment, contact plugs 41 are formed in the central area of each active region, and a narrow shallow trench isolation (STI) 7 is disposed at the ends of the active region. A nitride film is formed in the inside of the trench of a shallow trench isolation (STI) 8 having a direction parallel to the channel as its longitudinal direction to thereby suppress oxidation. No nitride film is formed in the trench of a shallow trench isolation (STI) 7 having a direction perpendicular to the channel as its longitudinal direction. With this structure, compression stress can be increased in the x-direction and decreased in the y-direction in the silicon substrate under the gate electrode. The nitride film is, preferably, a film formed by a nitridation process relative to the trench wall or a silicon nitride film formed by CVD. By combining the first to third embodiments to the fourth embodiment, the effect can be further enhanced. Drain current of the p-channel field effect transistor can be increased and the performance can be prevented from being degraded. Alternatively, the gate electrode area of the transistor can be reduced by an amount corresponding to an increase in drain current. Therefore, the area of the semiconductor device including the plan layout can be reduced further.

Figure 16:
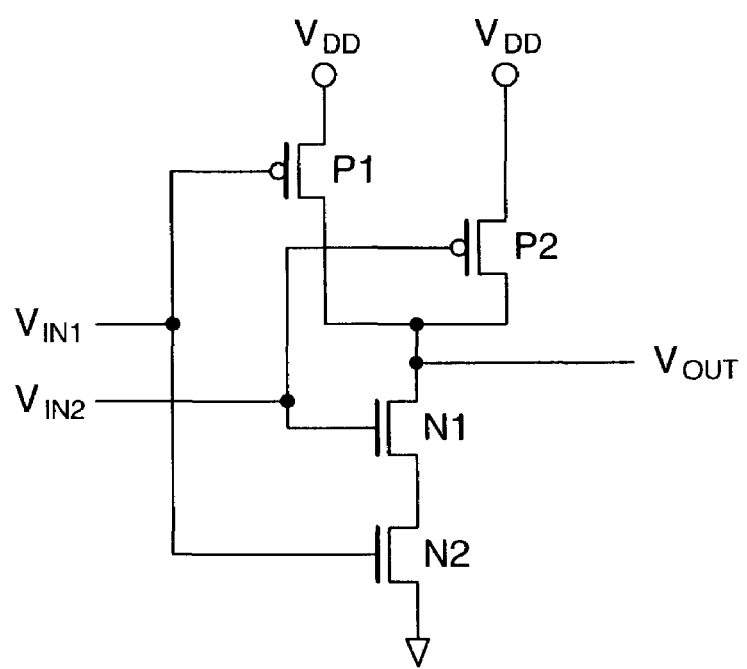
FIG. 16 is a circuit diagram of a two-input NAND circuit.
Figure 17:
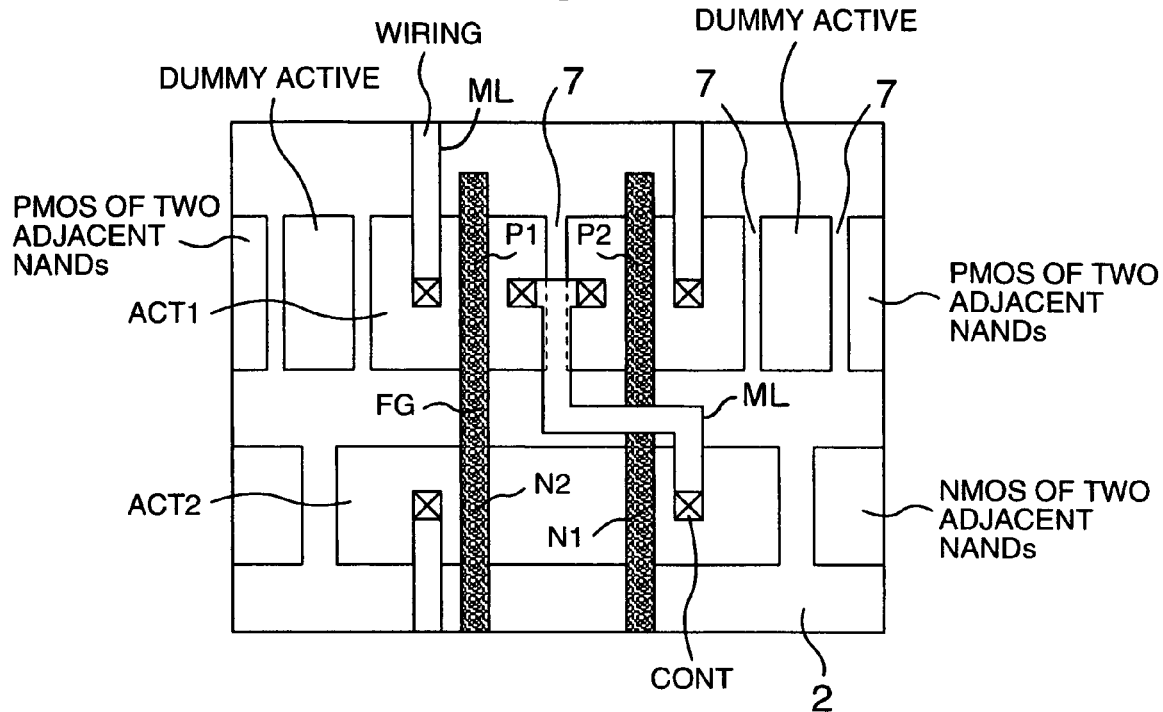
FIG. 17 is a schematic diagram showing the plan pattern of a semiconductor device according to a fifth embodiment of the invention.
Figure 18:
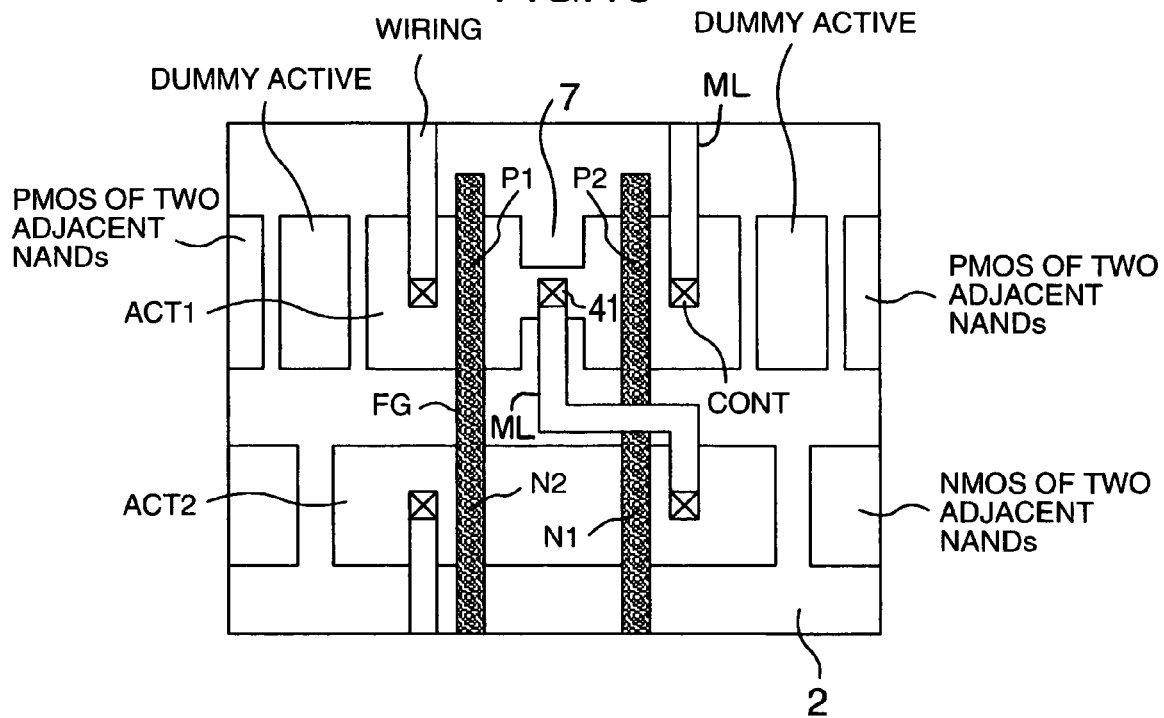
FIG. 18 is a schematic diagram showing another plan pattern of the semiconductor device of the fifth embodiment.
Figure 19:
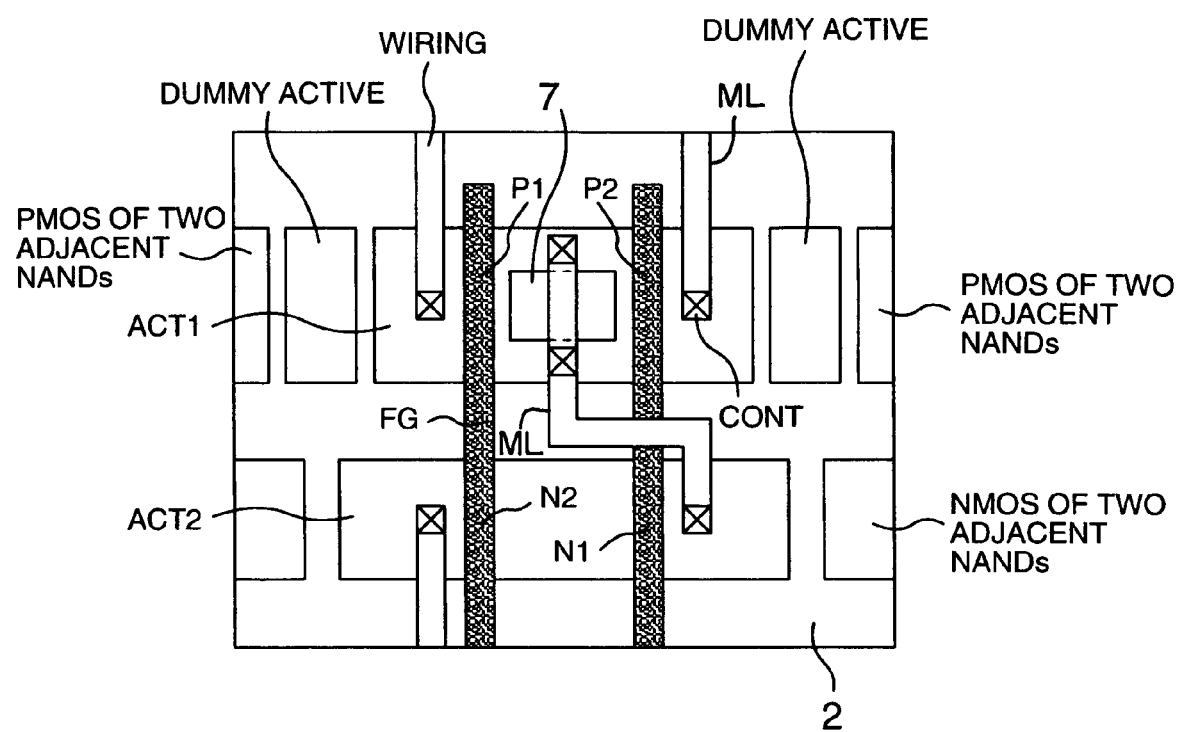
FIG. 19 is a schematic diagram showing a further plan pattern of the semiconductor device of the fifth embodiment.

Next, a fifth embodiment of the invention will be described with reference to FIGS. 16 to 19. The fifth embodiment is applied to a two-input NAND circuit shown in FIG. 16. FIG. 16 is a circuit diagram of a two-input NAND circuit to which the fifth embodiment is applied. FIGS. 17 to 19 show schematic plan layouts of a semiconductor device according to the fifth embodiment of the invention.

The two-input NAND circuit shown in FIG. 16 to which the fifth embodiment is applied is constituted of two p-channel field effect transistors P1 and P2 and two n-channel field effect transistors N1 and N2. These transistors N1, N2, P1 and P2 correspond to transistors N1, N2, P1 and P2 shown in FIGS. 17 to 19, respectively.

Each two-input NAND circuit shown in FIGS. 17 to 19 is constituted of the p-channel field effect transistor P1 and n-channel field effect transistor N2 having a common gate electrode FG and, similarly, in the case of the p- and n-channel field effect transistors P2 and N1, in which, also, contact plugs CONT and wiring lines ML are provided for electrically connecting these transistors. The p-channel field effect transistors P1 and P2 are formed in one active region ACT 1 (FIGS. 18 and 19) or in two active regions ACT1 (FIG. 17), and the n-channel field effect transistors N1 and N2 are formed in one active region ACT2 (FIGS. 17 to 19).

The semiconductor device of this embodiment has a pattern in which a plurality of two-input NAND circuits are repetitively juxtaposed. Namely, as shown in FIGS. 17 to 19 pairs of p-channel field effect transistors P1 and P2 and pairs of n-channel field effect transistors N2 and N1 are repetitively juxtaposed.

The characteristic feature of this embodiment resides in that a shallow trench isolation (STI) 7 is formed between adjacent p-channel field effect transistors P1 and P2. This shallow trench isolation 7 is, preferably, narrower than the trench formed between the transistors P1 and N2 and between the transistors P2 and N1. The stress parallel to the channel under the gate electrode of the p-channel field effect transistor is changed to compression stress by utilizing volume expansion caused by side wall oxidation of the narrow shallow trench isolation (STI) 7. Furthermore, the stress parallel to the channel under the gate electrode of the p-channel field effect transistor is changed to compression stress by disposing the narrow shallow trench isolation (STI) 7 between two adjacent two-input NAND circuits. Although the width of the shallow trench isolation (STI) 7 is desired to be 0.25 µm or narrower, the effects of the embodiment can be obtained even if the width is wider than 0.25 µm. The active region is disposed as short as possible in the x-direction so that the distance from the gate electrode to the peripheral STI becomes short. With this layout, the influence of compression stress under the gate electrode to be caused by STI surrounding the gate electrode can be enhanced so that drain current of the p-channel field effect transistors P1 and P2 can be increased.

The narrow shallow trench isolation (STI) 7 is not provided for the n-channel field effect transistors N1 and N2. The active region is made long in the x-direction so that the distance from the gate electrode to the peripheral STI becomes long. With this layout, the influence of compression stress under the gate electrode to be caused by STI surrounding the gate can be weakened so that drain current of the n-channel field effect transistors N1 and N2 can be increased.

As described above, drain current of both the n- and p-channel field effect transistors can be increased by making the length of the active region of the n-channel field effect transistor in the x-direction longer than the length of the active region of the p-channel field effect transistor in the x-direction. In this case, there is a possibility that the width of STI between adjacent two p-channel field effect transistors becomes wide and compression stress in the x-direction lowers. To avoid this, a dummy active region is disposed between adjacent two p-channel field effect transistors so that the width of STIs between the adjacent two p-channel field effect transistors can be made narrow and compression stress in the x-direction can be increased. FIG. 18 shows another embodiment similar to the embodiment illustrated in FIG. 17, in which the contact plug 41 is arranged on the central part of the device, and the narrow STI 7 is arranged thereof.

In this embodiment, even if the dummy region is not formed, drain current can be increased more than the comparative example. It is, however, preferable to form the dummy active region. A NAND circuit is not formed in the dummy active region surrounded by the shallow trench isolation between PMOSs of adjacent two two-input NANDs.

The two-input NAND circuit to which the fifth embodiment is applied is one example of applying the invention to an electronic circuit layout. Plan layouts different from the embodiment may be used, and an electronic circuit to be applied may be an AND circuit, a NOR circuit, an OR circuit, an input/output buffer circuit and the like.

According to the embodiment, a high speed or high performance semiconductor device can be manufactured by changing the mask layout without changing other manufacture processes. A semiconductor device excellent in the manufacture cost can be obtained.

In the embodiment shown in FIG. 19, a narrow shallow trench isolation (STI) 7 is inserted in the active region of only a p-channel field effect transistor in an area spaced apart from contact plugs. In this manner, the narrow shallow trench isolation (STI) 7 may be disposed in an area spaced apart from contact plugs.

With this layout, the distance between gate electrodes in the x-direction can be made shorter than the first and second embodiments. Since the compression stress in the x-direction can be increased only for the p-channel field effect transistor, drain current of p-channel field effect transistors can be increased. Even if the dummy active regions are not formed in the plan circuit pattern shown in FIG. 19, a sufficient effect can be obtained as compared to the comparative example, although the effect is slightly lowered.

According to the present invention, a semiconductor device having p-channel field effect transistors excellent in the drain current characteristics can be obtained.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor device comprising
    a semiconductor substrate;
    a plurality of gate electrodes constituting p-channel field effect transistors formed in and on said semiconductor substrate; and
    a plurality of spatially arranged active regions formed with areas intersected by portions of said gate electrodes, respectively, to constitute said p-channel field effect transistors together with said plurality of gate electrodes,
    wherein:
    said plurality of gate electrodes include a first gate electrode and a second gate electrode having a longitudinal direction the same as a longitudinal direction of said first gate electrode, and said first and second gate electrodes are juxtaposed;
    said plurality of active regions include a first active region including an area intersected by a portion of said first gate electrode and a second active region including an area intersected by a portion of said second gate electrode; and
    a trench is formed between said first and second active regions along said longitudinal direction of said first and second electrodes, and formed along with said first and second active regions in a traverse direction of said longitudinal direction, a width of said trench formed in the traverse direction of said longitudinal direction being wider than that of said trench formed along said longitudinal direction,
    wherein the width of said trench formed between said first and second active regions in said longitudinal direction of said first and second electrodes is 0.25 µm or narrower.

2. A semiconductor device comprising:
    a semiconductor substrate;
    a plurality of gate electrodes constituting p-channel field effect transistors formed in and on said semiconductor substrate; and
    a plurality of spatially arranged active regions formed with areas intersected by portions of said gate electrodes, respectively, to constitute said p-channel field effect transistors together with said plurality of gate electrodes,
    wherein:
    said plurality of gate electrodes include a first gate electrode and a second gate electrode having a longitudinal direction the same as a longitudinal direction of said first gate electrode, and said first and second gate electrodes are juxtaposed;

said plurality of active regions include a first active region including an area intersected by a portion of said first gate electrode and a second active region including an area intersected by a portion of said second gate electrode; and a trench is formed between said first and second active regions along said longitudinal direction of said first and second electrodes, and formed along with said first and second active regions in a traverse direction of said longitudinal direction, a width of said trench formed in the traverse direction of said longitudinal direction being wider than that of said trench formed along said longitudinal direction, further comprising:

a third active region, arranged in said longitudinal direction relative to said first active region, including an area intersected by a portion of said first gate electrode, said third active region being separated from said first active region by said trench formed in the traverse direction of said longitudinal direction, said third active region constituting a p-channel field effect transistor together with said first gate electrode, wherein a distance between said first and third active regions is set longer than a distance between said first and second active regions.

3. A semiconductor device according to claim 2 wherein said plurality of active regions are arranged in an array-like structure.

4. A semiconductor device comprising:

a semiconductor substrate;

a plurality of gate electrodes constituting p-channel field effect transistors formed in and on said semiconductor substrate; and a plurality of array-like laterally and vertically arranged active regions formed with areas intersected by portions of said gate electrodes, respectively, each of said active regions being arranged with a predetermined space, to respectively constitute said p-channel field effect transistors together with said plurality of gate electrodes wherein:

said plurality of gate electrodes are extended through vertically arranged active regions, respectively;

each of said vertically arranged active regions includes an area intersected by a portion of one of said gate electrodes; and trenches are laterally formed between said vertically arranged active regions and vertically formed between laterally arranged active regions, a width of said laterally formed trench being wider than that of said vertically formed trench.

5. A semiconductor device according to claim 4, wherein the width of said vertically formed trench is equal to or less than 0.25 μm.

6. A semiconductor device according to claim 4, wherein a width of said gate electrode is equal to or less than 0.25 μm.

7. A semiconductor device comprising;

a semiconductor substrate;

a plurality of gate electrodes, constituting channel field effect transistors, formed in and on said semiconductor substrate; and a plurality of spatially arranged active regions formed with areas intersected by portions of said gate electrodes, respectively, to constitute said p-channel field effect transistors together with said plurality of gate electrodes, wherein:

said plurality of gate electrodes include a first gate electrode and a second gate electrode having a longitudinal direction the same as a longitudinal direction of said first gate electrode;

said plurality of active regions include a first active region including an area intersected by a portion of said first gate electrode and a second active region including an area intersected by a portion of said second gate electrode; and a third active region formed with areas intersected by portions of said first and second gate electrodes, respectively, to constitute n-channel field effect transistors together with said first and second gate electrodes, wherein:

a dummy active region located between the first active region and a fourth active region, which constitutes a p-channel field effect transistor, said fourth active region being located along a traverse direction of said longitudinal direction relative to said first active region;

a first trench formed between the dummy active region and the first active region;

a fifth active region located adjacent to said third active region to constitute an n-channel field effect transistor, said fifth active region being located along said direction traverse to the longitudinal direction relative to said third active region; and a second trench located between the third active region and the fifth active region, wherein a width of said first trench is less than a width of said second trench.

* * * * *